(12) United States Patent
Lin et al.

(10) Patent No.: US 6,812,099 B2
(45) Date of Patent: Nov. 2, 2004

(54) METHOD FOR FABRICATING NON-VOLATILE MEMORY HAVING P-TYPE FLOATING GATE

(75) Inventors: Hung-Sui Lin, Tainan (TW); Nian-Kai Zous, Tauyuan Hsien (TW); Tao-Cheng Lu, Kaoshiung (TW); Kent Kuohua Chang, Taipei (TW)

(73) Assignee: MACRONIX International Co., Ltd., Hsinchu (TW)

( * ) Notice: Subject to any disclaimer, the term of this patent is extended or adjusted under 35 U.S.C. 154(b) by 35 days.

(21) Appl. No.: 10/139,119

(22) Filed: May 2, 2002

(65) Prior Publication Data

US 2003/0199143 A1 Oct. 23, 2003

(30) Foreign Application Priority Data

Apr. 16, 2002 (TW) ........................................ 91107692 A

(51) Int. Cl.⁷ ............................................ H01L 21/336
(52) U.S. Cl. ........................................ 438/262; 438/594
(58) Field of Search ................................ 438/257, 258, 438/262, 263, 264, 266, 594

(56) References Cited

U.S. PATENT DOCUMENTS 5,723,375 A * 3/1998 Ma et al.
6,579,762 B2 * 6/2003 Io

* cited by examiner

*Primary Examiner*—Phuc T. Dang
(74) *Attorney, Agent, or Firm*—J.C. Patents

(57) ABSTRACT

A method for fabricating a non-volatile memory having a P-type floating gate is described. A tunneling layer is formed on a substrate and then a first patterned polysilicon layer is formed on the tunneling layer. A buried drain is formed in the substrate beside the first polysilicon layer and then an insulating structure is formed on the tunneling layer on the buried drain. Thereafter, a second polysilicon layer is formed on the first polysilicon layer to constitute a floating gate together with the first polysilicon layer. A P-type ion is implanted into the second polysilicon layer and then a dielectric layer and a control gate are sequentially formed on the floating gate. A thermal process is then performed to make the P-type, ion in the second polysilicon layer diffuse into the first polysilicon layer.

20 Claims, 4 Drawing Sheets

METHOD FOR FABRICATING NON-VOLATILE MEMORY HAVING P-TYPE FLOATING GATE

CROSS-REFERENCE TO RELATED APPLICATION

This application claims the priority benefit of Taiwan application serial no. 91107692, filed Apr. 16, 2002.

BACKGROUND OF THE INVENTION

1. Field of Invention

The present invention relates to a method for fabricating a non-volatile memory. More particularly, the present invention relates to a method for fabricating a non-volatile memory having a P-type floating gate.

2. Description of Related Art

A non-volatile memory is capable of retaining data even when the power is switched off. The non-volatile memory devices can be divided into several types according to their operating methods, including mask read-only memory (Mask ROM), programmable read-only memory (PROM), erasable programmable read-only memory (EPROM), electrically erasable programmable read-only memory ($E^2$PROM), and Flash memory.

Among various types of non-volatile memory, EPROM, $E^2$PROM and Flash memory all use floating gates for charge storage, wherein the floating gates usually comprise N-doped polysilicon. A conventional non-volatile memory having polysilicon floating gates and the fabrication thereof are described as follows.

Refer to FIGS. 1A~1C, which illustrate the process flow of fabricating a conventional non-volatile memory having an N-type floating gate in a cross-sectional view.

Refer to FIG. 1A, a tunnel oxide layer 102 is formed on a substrate 100 and then a polysilicon floating gate 104 is formed on the tunnel oxide layer 102.

Refer to FIG. 1B, an N-type buried drain 106 is formed in the substrate 100 beside the floating gate 104 by conducting an N-type ion implantation with the floating gate 104 as a mask. Since the floating gate 104 is simultaneously doped with the N-type ion used for implantation, the floating gate 104 has N-type conductivity.

Refer to FIG. 1C, a conformal dielectric layer 108 is formed on the tunnel oxide layer 102 and the floating gate 104 to serve as an inter-gate dielectric layer. A control gate 110 is then formed on the conformal dielectric layer 108.

The non-volatile memory having a floating gate is programmed by injecting electrons into the floating gate. However, since the floating gate in the conventional non-volatile memory is of N-type, the excess electrons at the interface between the floating gate and the tunnel oxide layer easily escape from the floating gate and tunnel into the substrate though the tunnel oxide layer. A leakage current is thus caused and the data retaining ability of the floating gate is therefore restricted.

SUMMARY OF THE INVENTION

Accordingly, this invention provides a method for fabricating a non-volatile memory having a P-type floating gate to solve the leakage problem encountered in the case of the N-type floating gate.

This invention also provides a method for fabricating a non-volatile memory having a P-type floating gate to improve the data retaining ability of the non-volatile memory.

The method for fabricating a non-volatile memory having a P-type floating gate of this invention is described as follows. A tunnel oxide layer is formed on a substrate and then a first patterned polysilicon layer, which comprises undoped polysilicon, is formed on the tunnel oxide layer. A buried drain is formed in the substrate beside the first polysilicon layer and then an insulating layer is formed covering the tunnel oxide layer and the first polysilicon layer. A chemical mechanical polishing (CMP) process or an etching-back process is performed to remove a portion of the insulating layer until the first polysilicon layer is exposed, whereby an insulating structure is left on the tunnel oxide layer on the buried drain. Thereafter, a second patterned polysilicon layer is formed on the first polysilicon layer to constitute a floating gate together with the first polysilicon layer. A P-type ion implantation is performed to dope the second polysilicon layer and then a dielectric layer is formed on the second polysilicon layer and the insulating structure. A control gate, which may also be of P-type, is formed on the dielectric layer. The P-type ions in the second polysilicon layer will diffuse into the first polysilicon layer during subsequent thermal processes to make the whole floating gate have P-type conductivity.

Since this invention uses a P-type floating gate in the non-volatile memory, the electrons stored in the floating gate will recombine with electron holes and the possibility of electrons escaping from the floating gate is therefore reduced, which means that the leakage current is decreased. Consequently, the data retaining ability of the non-volatile memory can be enhanced.

Moreover, since the P-type ion is implanted only into the second polysilicon layer but not into the first polysilicon layer, the P-type ion can be prevented from diffusing into the substrate through the tunneling layer during subsequent thermal processes.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
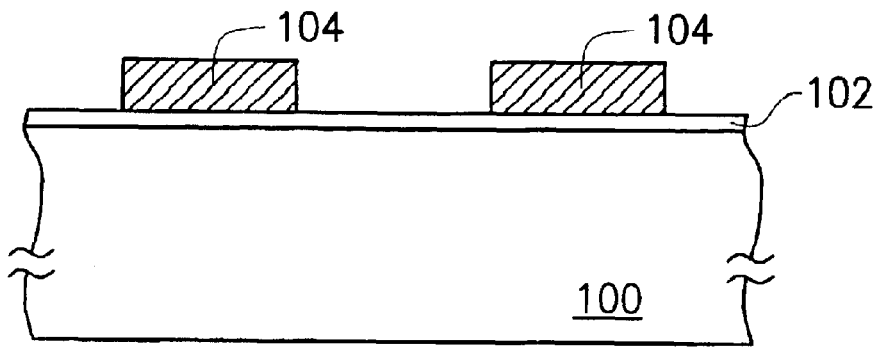
FIGS. 1A~1C illustrate the process flow of fabricating a conventional non-volatile memory having an N-type floating gate in a cross-sectional view.
Figure 1B:
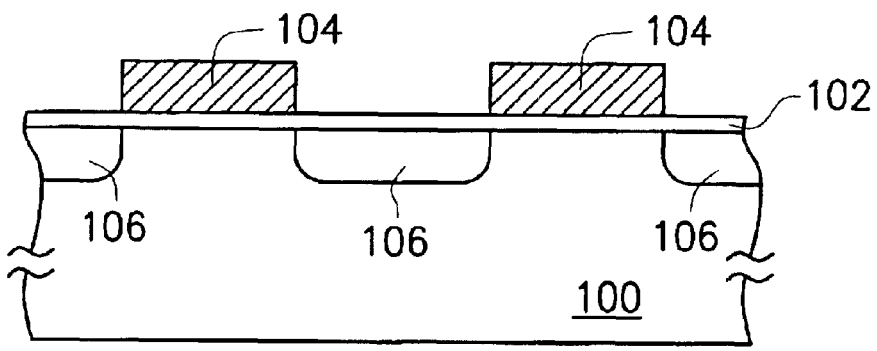
Figure 1C:
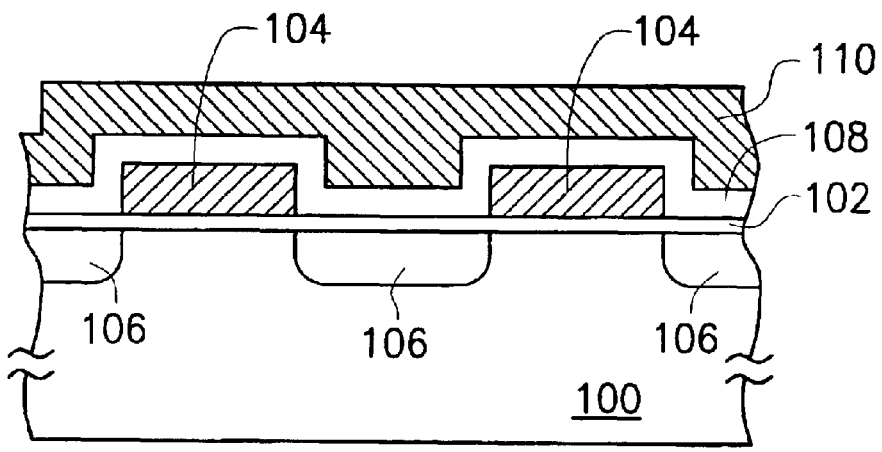
Figure 2A:
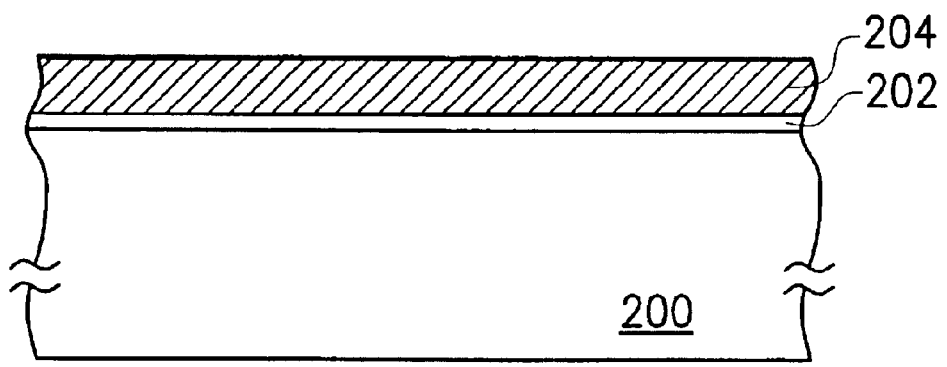
FIGS. 2A~2G illustrate the process flow of fabricating a non-volatile memory having a P-type floating gate according to a preferred embodiment of this invention in a cross-sectional view.

Refer to FIG. 2A, a tunneling layer 202 is formed on a substrate 200, wherein the tunneling layer 202 comprises, for example, silicon oxide. A first polysilicon layer 204 is formed on the tunnel oxide layer 202, while the first polysilicon layer 204 can be replaced by a layer of another electrically conductive material. In this embodiment, the first polysilicon layer 204 is an undoped polysilicon layer and has a thickness of 400 Å~800 Å, preferably 600 Å, for example.

Figure 2B:
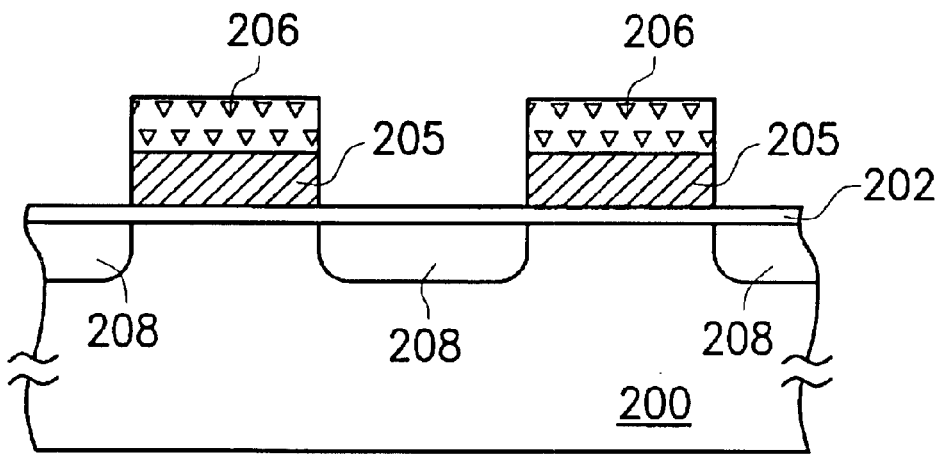

Refer to FIG. 2B, a patterned photoresist layer 206 is formed on the polysilicon layer 204 and then the polysilicon layer 204 is anisotropically etched to form a first patterned polysilicon layer 205 by using the photoresist layer 206 as a mask. A buried drain 208 is formed in the substrate 200 beside the first polysilicon layer 205 by conducting an ion implantation with the photoresist layer 206 as a mask.

Figure 2C:
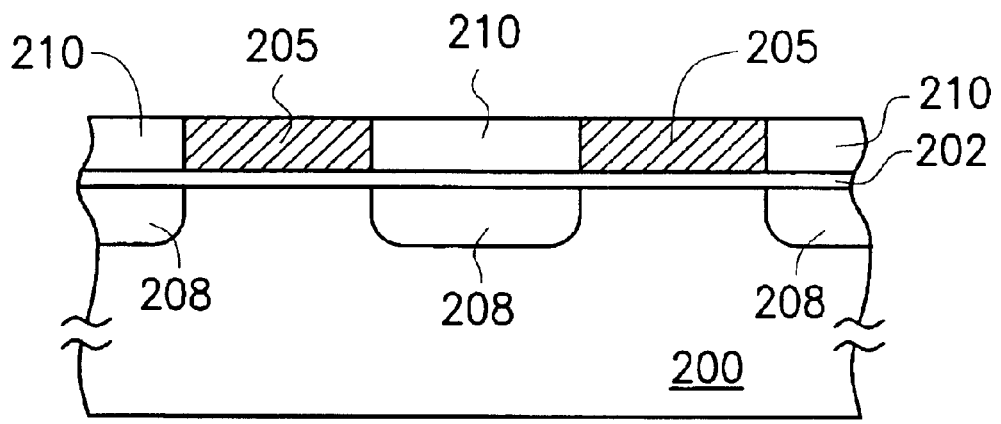

Refer to FIG. 2C, the photoresist layer 206 is removed and then an insulating structure 210 is formed on the tunneling layer 202 on the buried drain 208. The insulating structure 210 comprises, for example, silicon oxide. The insulating structure 210 is formed by, for example, forming an insulating layer (not shown) covering the tunneling layer 202 and the first polysilicon layer 205 and then removing a portion of the insulating layer by performing CMP or etching-back until the first polysilicon layer 205 is exposed.

Figure 2D:
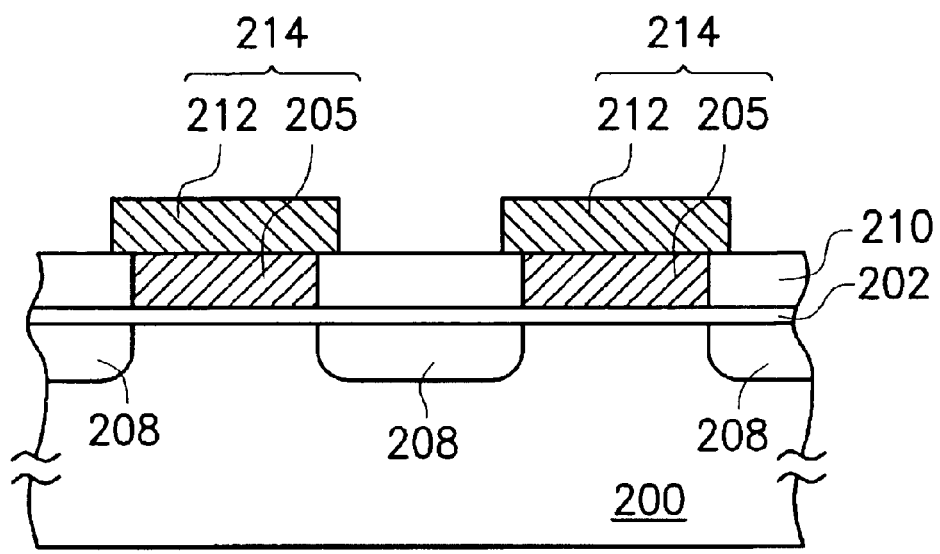

Refer to FIG. 2D, a second patterned polysilicon layer 212 is formed on the first polysilicon layer 205, wherein the thickness of the second polysilicon layer 212 is, for example, 800 Å~1200 Å, preferably about 1000 Å. The second polysilicon layer 212 has a width larger than that of the first polysilicon layer 205, so the two polysilicon layers 205 and 212 together constitute a T-shape floating gate 214. Besides, if required, the second polysilicon layer 212 can be replaced by a layer of another electrically conductive material.

Figure 2E:
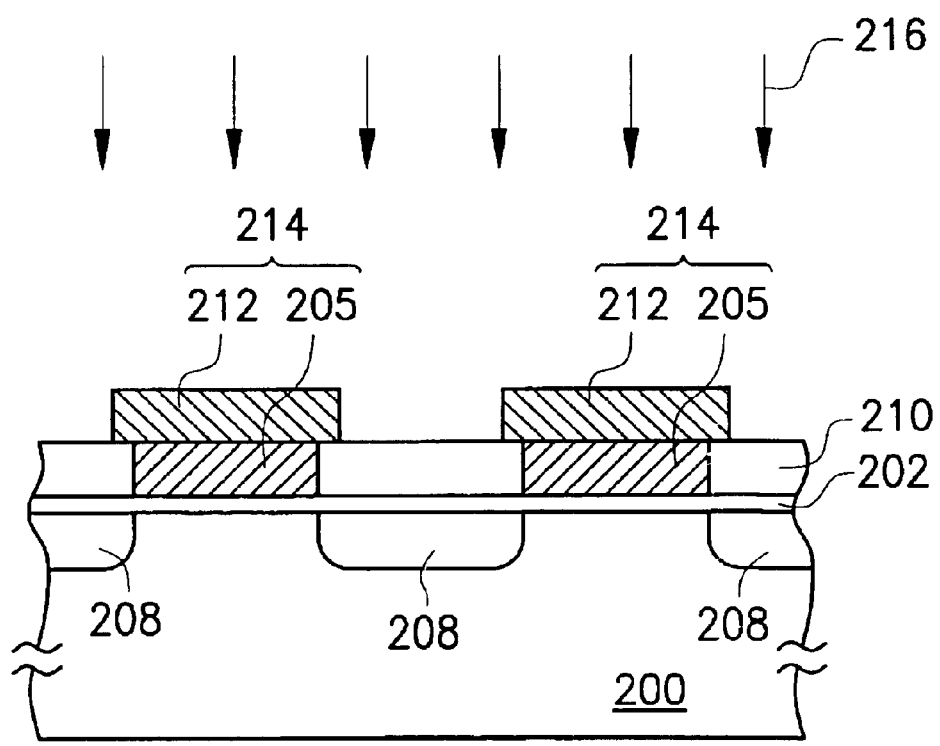

Refer to FIG. 2E, a P-type ion implantation 216 is conducted to dope the second polysilicon layer 212. The P-type ion implantation 216 uses a P-type ion such as boron ion ($B^+$) and boron difluoride ion ($BF_2^+$). The implanting dosage of the P-type ion implantation 216 is $10^{13}$~$10^{14}$/cm$^2$ and the implanting energy is 20~40 KeV, for example.

Figure 2F:
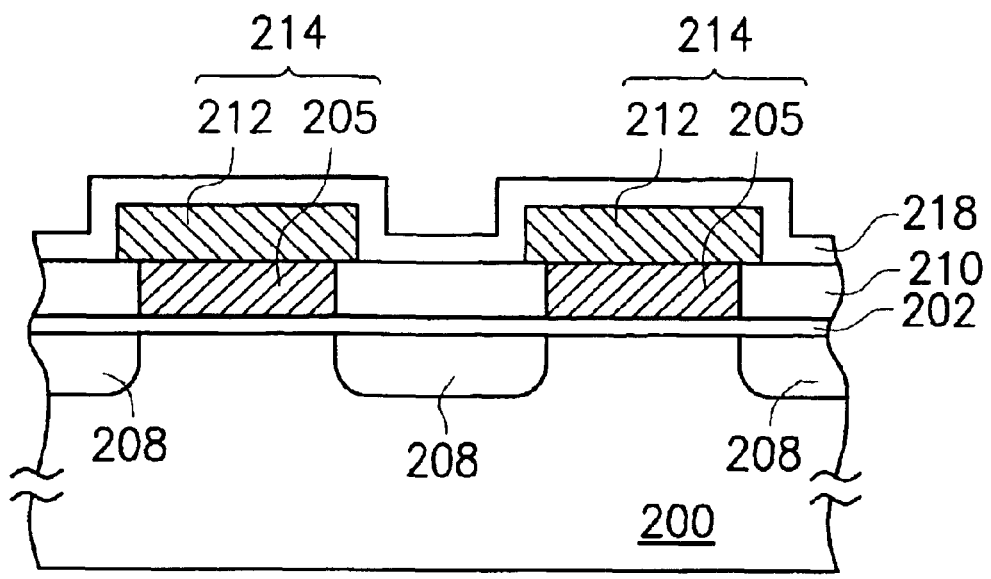

Refer to FIG. 2F, a conformal dielectric layer 218 is formed on the second polysilicon layer 212 and the insulating structure 210 to serve as an inter-gate dielectric layer. The dielectric layer 218 is, for example, a silicon oxide/silicon nitride/silicon oxide (ONO) stacked layer.

Figure 2G:
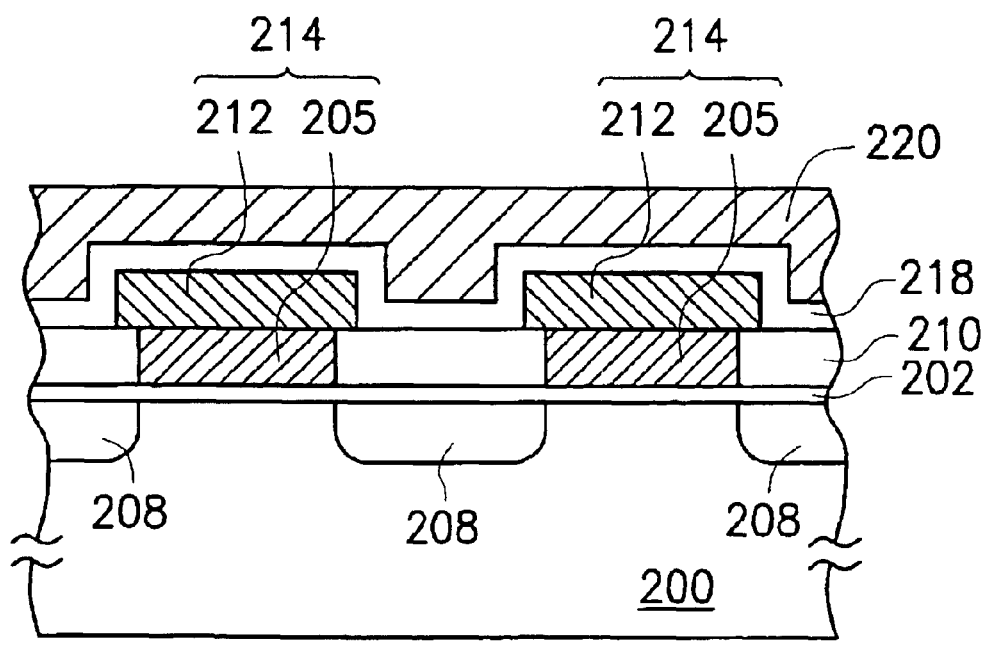

Refer to FIG. 2G, a control gate 220 is formed on the dielectric layer 218. The control gate 220 comprises a material such as polysilicon and can also be of P-type. The P-type ions in the second polysilicon layer 212 will diffuse into the first polysilicon layer 205 to make the whole floating gate 214 have P-type conductivity, and the fabrication of the non-volatile memory having a P-type floating gate is thus completed.

Since this invention uses a P-type floating gate 214 in the non-volatile memory, the electrons stored in the floating gate 214 will recombine with electron holes and the possibility of electrons escaping from the floating gate 214 and tunneling through the tunneling layer 202 into the substrate 200 can be much reduced. Consequently, as compared with the conventional non-volatile memory having a N-type floating gate, the non-volatile memory having a P-type floating gate has a leakage current reduced by several orders and therefore has a superior data retaining ability.

Moreover, since the first polysilicon layer 205 is undoped and the P-type ions are implanted into the second polysilicon layer, the P-type ions will diffuse only from the second polysilicon layer 212 to the first polysilicon layer 205, but not into the substrate 200 through the tunneling layer 202.

In summary, by using the method for fabricating a non-volatile memory having a P-type floating gate of this invention, the possibility of electrons escaping from the floating gate can be reduced and the leakage therefore can be decreased. In addition, the P-type ions can be prevented from diffusing into the substrate through the tunneling layer.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for fabricating a non-volatile memory having a P-type floating gate, comprising the steps of:
    forming a tunneling layer on a substrate;
    forming a first patterned, undoped conductive layer on the tunneling layer;
    forming a buried drain in the substrate beside the first patterned conductive layer;
    forming an insulating structure on the buried drain;
    forming a second patterned conductive layer on the first patterned conductive layer to constitute a floating gate together with the first patterned conductive layer;
    performing a P-type implantation to dope the second patterned conductive layer with a P-type ion;
    forming a dielectric layer on the second patterned conductive layer and the insulating structure; and
    forming a control gate on the dielectric layer.

2. The method of claim 1, further comprising performing a thermal process to make the P-type ion in the second conductive layer diffuse into the first conductive layer.

3. The method of claim 1, wherein the P-type ion is boron ion ($B^+$) or boron difluoride ion ($BF_2^+$).

4. The method of claim 1, wherein the P-type implantation uses an implanting dosage of $10^{13}$~$10^{14}$/cm$^2$.

5. The method of claim 1, wherein the P-type implantation uses an implanting energy of 20~40 KeV.

6. The method of claim 1, wherein the first conductive layer comprises undoped polysilicon.

7. The method of claim 6, wherein the first conductive layer has a thickness of about 400~800 Å.

8. The method of claim 1, wherein the second conductive layer comprises polysilicon.

9. The method of claim 8, wherein the second conductive layer has a thickness of about 800~1200 Å.

10. The method of claim 1, wherein the control gate comprises a P-type control gate.

11. The method of claim 1, wherein the dielectric layer comprises a silicon oxide/silicon nitride/silicon oxide (ONO) stacked layer.

12. The method of claim 1, wherein the insulating structure comprises silicon oxide.

13. The method of claim 1, wherein forming the insulating structure on the buried drain comprising:
    forming an insulating layer covering the first conductive layer; and
    removing a portion of the insulating layer until the first conductive layer is exposed.

14. A method for fabricating a P-type floating gate, comprising the steps of:
    forming a first patterned polysilicon layer on a substrate;
    forming an insulating layer on the substrate covering the first patterned polysilicon layer;
    removing a portion of the insulating layer until the first patterned polysilicon layer is exposed;
    forming a second patterned polysilicon layer on the first patterned polysilicon layer;
    performing a P-type implantation to dope the second patterned polysilicon layer with a P-type ion; and
    performing a thermal process to make the P-type ion in the second patterned polysilicon layer diffuse into the first polysilicon patterned layer, wherein the first polysilicon patterned layer and the second polysilicon patterned layer together serve as a floating gate.

15. The method of claim 14, wherein the P-type ion is boron ion ($B^+$) or boron difluoride ion ($BF_2^+$).

16. The method of claim 14, wherein the P-type implantation uses an implanting dosage of $10^{13}$~$10^{14}$/cm$^2$.

17. The method of claim 14, wherein the P-type implantation uses an implanting energy of 20~40 KeV.

18. The method of claim 14, wherein the first polysilicon layer has a thickness of about 400~800 Å.

19. The method of claim 14, wherein the second polysilicon layer has a thickness of about 800~1200 Å.

20. The method of claim 14, wherein the insulating layer comprises silicon oxide.

* * * * *